United States Patent [19]

Schultze et al.

[11] Patent Number: 4,901,009
[45] Date of Patent: Feb. 13, 1990

[54] METHOD AND DEVICE FOR THE AUTOMATIC RECORDING OF SIGNAL CURVES

[75] Inventors: Wolfgang Schultze, Nüremberg; Werner Tödter, Soltau; Reinhold Kern, Neumarkt/Opf, all of Fed. Rep. of Germany

[73] Assignee: Asea Brown Boveri Aktiengesellschaft, Mannheim, Fed. Rep. of Germany

[21] Appl. No.: 291,508

[22] Filed: Dec. 29, 1988

[30] Foreign Application Priority Data

Dec. 29, 1987 [DE] Fed. Rep. of Germany ....... 3744398

[51] Int. Cl.⁴ .................. G01R 13/20; G01R 13/32
[52] U.S. Cl. .............................. 324/121 R; 340/715; 364/487
[58] Field of Search .................. 384/121 R, 23 R; 340/712, 720, 722; 346/35; 364/487

[56] References Cited

U.S. PATENT DOCUMENTS

| | | | |
|---|---|---|---|
| 3,172,039 | 3/1965 | Bernstein | 324/73 R |
| 4,200,896 | 4/1980 | Baumann | 340/715 |
| 4,249,186 | 2/1981 | Edwards | |
| 4,386,614 | 6/1983 | Ryan | 340/722 |
| 4,536,760 | 8/1985 | Nabarro et al. | 324/121 R |
| 4,734,640 | 3/1988 | Kitahori et al. | 324/121 R |
| 4,818,932 | 4/1989 | Odenheimer | 324/121 R |

FOREIGN PATENT DOCUMENTS

| | | |
|---|---|---|
| 0215515 | 3/1987 | European Pat. Off. |
| 2103816 | 3/1972 | Fed. Rep. of Germany |
| 2605705 | 8/1976 | Fed. Rep. of Germany |
| 2837245 | 3/1979 | Fed. Rep. of Germany |
| 2850082 | 5/1980 | Fed. Rep. of Germany |
| 2033824 | 1/1982 | Fed. Rep. of Germany |

OTHER PUBLICATIONS

Elektronik, Apr. 18, 1986; Publication 8; pp. 132-136.
Elektronik, Jul. 29, 1983; Publication 15; pp. 67-72.
Elektronik, Jul. 16, 1982; Publication 14; pp. 53-58.

*Primary Examiner*—Gerard R. Strecker
*Assistant Examiner*—W. Burns
*Attorney, Agent, or Firm*—Herbert L. Lerner; Laurence A. Greenberg

[57] ABSTRACT

In a digital oscilloscope, the recording of transients exceeding a predetermined tolerance range is to be provided by simple means. A method and a device for carrying out this method are provided in which two envelope curves are stored in an envelope curve memory and these are then compared with cyclically repetitive amplitude samples of a signal curve. A trigger signal ensures that the signal curve containing the disturbance is served if one of the signal curves exceeds the tolerance range delimited by the envelope curves, which is the case, in particular, when interference signals occur. This curve can then be displayed for analysis on the screen. The invention can be applied within the context of digital measuring technology wherever signal curves are recorded and instantaneous disturbances must be detected.

15 Claims, 2 Drawing Sheets

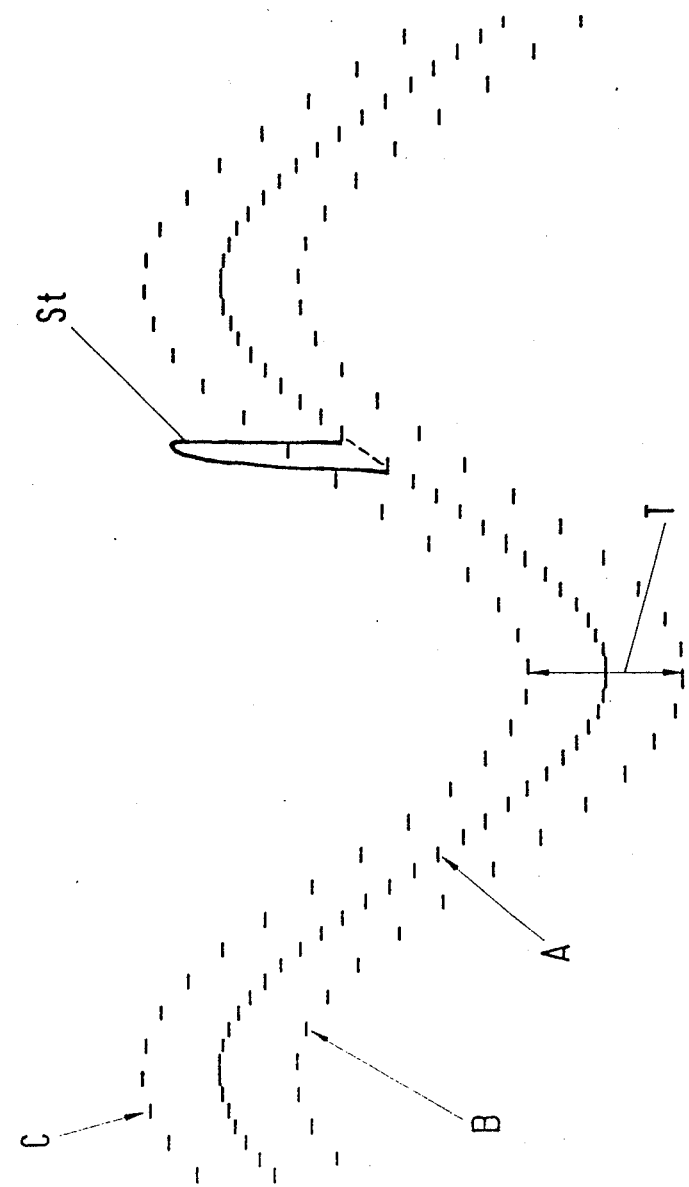

METHOD AND DEVICE FOR THE AUTOMATIC RECORDING OF SIGNAL CURVES

The invention relates to a method for recording signal curves which includes dissecting the signal curves into digitized amplitude samples and supplying them to a signal memory, determining the signal curve to be stored with an analog trigger and subsequently displaying an image of at least part of the stored signal curve on a screen, and a device for carrying out the method including an A/D converter for converting analog signal curves into digital amplitude samples, a signal memory which can be continuously overwritten with cyclically repetitive amplitude samples of a signal curve, a signal reproducing circuit for displaying an image of the signal curve on a screen, and a processor for determining an operational sequence.

In order to construct digital oscilloscopes, it is known to first dissect analog signal curves which are to be represented as an image, into individual amplitude samples, to digitize these samples, to supply them then to a signal store or memory and finally to display the content of the signal memory.

With respect to the differences as compared with an analog oscilloscope, the storage of the amplitude samples in the signal store or memory is of particular significance in a digital oscilloscope On one hand, this of necessity results in a delay as compared with an analog oscilloscope operating in real time but this is without significance with the high operating speed of modern oscilloscopes. On the other hand, the intermediate storage opens possibilities which are basically not available to analog technology. These possibilities are based on the fact that a stored signal curve, in principle, is available for an arbitrary length of time for an analysis of its curve shape.

In normal operation, however, new amplitude samples are continuously read into the signal store or memory, which is usually implemented as a RAM, during which process the amplitude samples of the preceding signal curve in each case are continuously overwritten. If a particular signal curve is then to be retained for a relatively long time for the purpose of analysis, two possibilities are available, in principle. Either the inflow of new amplitude samples into the signal curve store or memory must be stopped so that the signal curve to be investigated is not erased by overwriting, or another store or memory must be available in which a signal curve can be stored if required The switching or trigger signal required for this purpose which must initiate the storing process, can be manually activated if an observer recognizes an irregular curve variation which he wants to observe closely However, there are narrow limits to manually activated triggering because instantaneous irregularities which are also called transients can pass very rapidly so that the response time of the observer is inadequate for giving the storing command quickly enough. On the other hand, however, a very long time may elapse before a transient occurs. Furthermore, the deviation may not be detectable by the eye, such as if there is a phase shift and the curve variation appears unchanged.

It is accordingly an object of the invention to provide a method and device for the automatic recording of signal curves, which overcomes the hereinafore-mentioned disadvantages of the heretofore-known methods and devices of this general type and which permits signal curve deviations exceeding a predetermined tolerance range to be automatically detected with little expenditure.

With the foregoing and other objects in view there is provided, in accordance with the invention, a method for recording signal curves which comprises dissecting the signal curves into digitized amplitude samples, supplying the digitized amplitude samples to a signal memory, determining the signal curve to be stored with an analog trigger, subsequently displaying an image of at least part of the stored signal curve on a screen, generating lower and upper envelope curves enclosing a tolerance range for a signal curve stored in the signal memory and storing the envelope curves in an envelope curve memory, continuously overwriting the signal memory with cyclically repetitive new amplitude samples of the signal curve, and comparing the new amplitude samples with time-analogous amplitude samples of the lower envelope curve and the upper envelope curve, issuing a first switching signal when one of the two envelope curves is exceeded by at least one amplitude sample of the signal curve, transferring amplitude samples of the signal curve arriving after the first switching signal into the signal memory until the end of the instantaneous signal curve, and generating a second switching signal at the end of the instantaneous signal curve and stopping the overwriting of the signal memory or transferring the amplitude values contained in the signal memory into a separate long-time store.

The tolerance range to be created is advantageously generated by an upper and a lower envelope curve which enclose all signal curves that can be considered normal and therefore should not activate a switching signal. The envelope curves, like the signal curves, are formed of digital amplitude samples and are stored in an envelope curve store or memory. Although the content of the envelope curve store or memory remains unchanged, the amplitude samples of the signal curves stored in the signal store or memory are cyclically repetitively overwritten. The signal store or memory thus contains the signal curve which in each case corresponds to the latest status. Simultaneously with its storage in the signal store or memory, the amplitude samples of the signal curve are compared with amplitude samples of the lower and upper envelope curve which correspond to the former samples in time. If one of the two envelope curves is exceeded by an amplitude sample of the signal curve, which is the case when an interference signal is superimposed, a first switching signal is activated. If very short disturbances are without significance, it is also possible to activate the first switching signal only if two or more amplitude samples have exceeded the tolerance range.

As a rule, it is of importance to store not only the interference signal itself but also the subsequent values of the signal curve. Therefore, according to the invention, the incoming amplitude samples of the signal curve are continuously transferred after the first switching signal into the signal store or memory up to the end of the curve. It is only at the end of the instantaneous signal curve that a second switching signal is generated and this stored curve is then saved. This can be done either by stopping the overwriting of the signal store or memory or by transferring the amplitude values then contained in the signal store or memory into a long-time store or memory. In both cases, the stored instantaneous signal curve is displayed on a screen.

An essential simplification is obtained if each of the two envelope curves is not stored in a separate store or memory but instead, in accordance with another mode of the invention, there is provided a method which comprises alternately successively storing the amplitude samples of the two envelope curves in the common envelope curve memory, and comparing one of two successive amplitude samples of the signal curve with the corresponding amplitude sample of the lower envelope curve and comparing the other of the two successive amplitude samples of the signal curve with the corresponding amplitude sample of the upper envelope curve.

Although in principle this creates the possibility that transients which in each case pass through the other one of the two envelope curves and last only one counting cycle are not detected, this is without any practical significance since in any case transients of such a short duration cannot be further analyzed and, at most, would be recognizable as a line on the screen even if they were detected.

With the objects of the invention in view, there is also provided a device for recording signal curves, comprising an A/D converter for converting analog signal curves into digital amplitude samples, a processor for determining an operational sequence, a signal reproduction circuit connected to the processor for displaying an image of the signal curve on a screen, a signal memory connected to the processor to be continuously overwritten with cyclically repetitive amplitude samples of a signal curve, an envelope curve memory connected to the processor for receiving two envelope curves calculated by the processor from amplitude samples of a selected signal curve in such a manner that the predetermined tolerance range is maintained, a comparison circuit connected to the A/D converter and to the memories for continuously synchronously comparing amplitude samples from the A/D converter with corresponding amplitude samples from the envelope curve memory, and a control circuit connected between the comparison circuit and the processor for causing the instantaneous signal curve to be saved after an amplitude sample of the signal curve has exceeded one of the envelope curves.

In accordance with another feature of the invention, the envelope curve memory receives an amplitude sample of an upper envelope curve and of a lower envelope curve from the processor, and successive addresses are alternately allocated to the lower envelope curve and to the upper envelope curve.

In accordance with a further feature of the invention, the comparison circuit includes first and second registers forming an input of the comparison circuit, the registers having inputs and outputs, the input of the first register receiving the amplitude samples of the signal curve from the A/D converter and the input of the second register receiving the amplitude samples of the envelope curves from the envelope curve memory, a comparator having inputs connected to the outputs of the registers for receiving respective A and B amplitude samples, the comparator having a first output switching to "high" when the amplitude samples A are less than the amplitude samples B and a second output switching to "high" when the amplitude samples A are greater than the amplitude samples B, and a multiplexer connected to the outputs of the comparator for delivering a switching signal as soon as one of the comparator outputs switches to "high".

The multiplexer ensures that the comparison signals delivered in parallel by the comparator are combined again to form a common serial signal. This is possible because the subsequent trigger circuit only has to recognize whether or not an amplitude sample has exceeded one of the two envelope curves but it is of no importance which one of the two envelope curves it was.

In accordance with an added feature of the invention, the signal curve memory receives the amplitude samples of the signal curve from the output of the first register.

In principle, the functions of the comparator circuit and of the control circuit can also be handled by the microprocessor. However, in order to implement high clock frequencies, conventional logic elements which may be disposed on a gate array are preferably used. Thus, in accordance with an additional feature of the invention, the control circuit includes a trigger circuit being connected to the multiplexer and triggered by the switching signal of the multiplexer, a clock transmitter connected to the processor and to the trigger circuit for determining a time sequence, and an address counter connected to the clock transmitter for predetermining addresses for the amplitude samples stored in the signal curve memory and in the envelope curve memory.

In accordance with yet another feature of the invention, the clock transmitter has an enable input connected to the processor, a hold input connected to the trigger circuit, and an output delivering three clock signals having frequencies "Clock", "Clock/2" and "Clock/4".

In accordance with yet a further feature of the invention, the clock transmitter includes a clock generator, and two toggle-type flip-flops connected downstream of the clock generator for dividing an output frequency of the clock generator first into the frequency Clock/2 and then into the frequency Clock/4.

In accordance with yet an added feature of the invention, the trigger circuit includes a trigger flip-flop, a trigger counter connected to the trigger flip-flop and acting as a post-trigger, and an AND gate having inputs respectively connected to the trigger flip-flop and to the trigger counter and an output delivering the hold signal to the hold input of the clock transmitter when triggering.

The hold signal ensures that either further overwriting of the signal store or memory with new amplitude samples of the signal curve is prevented or that the instantaneous signal curve contained in the signal store or memory at this time is transferred into a separate long-time store or memory from which it can then be displayed on the screen.

An analog trigger determines the beginning of storage of a new signal curve into the signal store or memory. For this purpose, in accordance with yet an additional feature of the invention, there is provided an analog trigger, the address counter, the toggle-type flip-flops of the clock transmitter and the trigger counter having reset inputs jointly receiving a reset signal from the analog trigger at the beginning of a new signal curve.

In accordance with still another feature of the invention, the analog trigger has an output, the trigger flip-flop has an inverting output, and there is provided another AND gate having an input connected to the output of the analog trigger and an input connected to the inverting output of the trigger flip-flop, the other AND gate delivering a reset signal only when the trigger flip-flop does not trigger.

A reset signal coming from the analog trigger thus remains ineffective if a transient exceeding the envelope curves starts the trigger circuit.

In accordance with still a further feature of the invention, the trigger counter has a counter range corresponding to that of the address counter and the trigger counter is controlled in synchronism with the address counter. As a rule, this is effected by the fact that when an over-flow signal is delivered by the trigger counter, the address counter has delivered its last address.

In conjunction with a "high" at the output of the trigger flip-flop, the first AND gate connected downstream thereof supplies a hold signal to the hold input of the clock transmitter if further over-writing of the signal store or memory is to be prevented. In this case, only the microprocessor can enable the clock transmitter again. As has already been mentioned above, there is the alternative possibility of transferring, in conjunction with the trigger signal, the instantaneous signal curve from the signal store or memory into a long-time store or memory.

In accordance with still an added feature of the invention, the trigger flip-flop and the trigger counter are timed with the frequency of the clock transmitter, the registers and the address counter are timed with the frequency Clock/2, and the multiplexer switches with the frequency Clock/4. Therefore, the frequency Clock provides twice the clock frequency for the trigger circuit as for the address counter. This ensures that the trigger circuit already responds to the same pulse which causes the comparator to signal the occurrence of a transient.

In accordance with a concomitant feature of the invention, the enable input of the clock transmitter is connected to a reset input of the trigger flip-flop.

Other features which are considered as characteristic for the invention are set forth in the appended claims.

Although the invention is illustrated and described herein as embodied in a method and device for the automatic recording of signal curves, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

FIG. 2 is a representation of the signal curve with two envelope curves.

Figure 1:
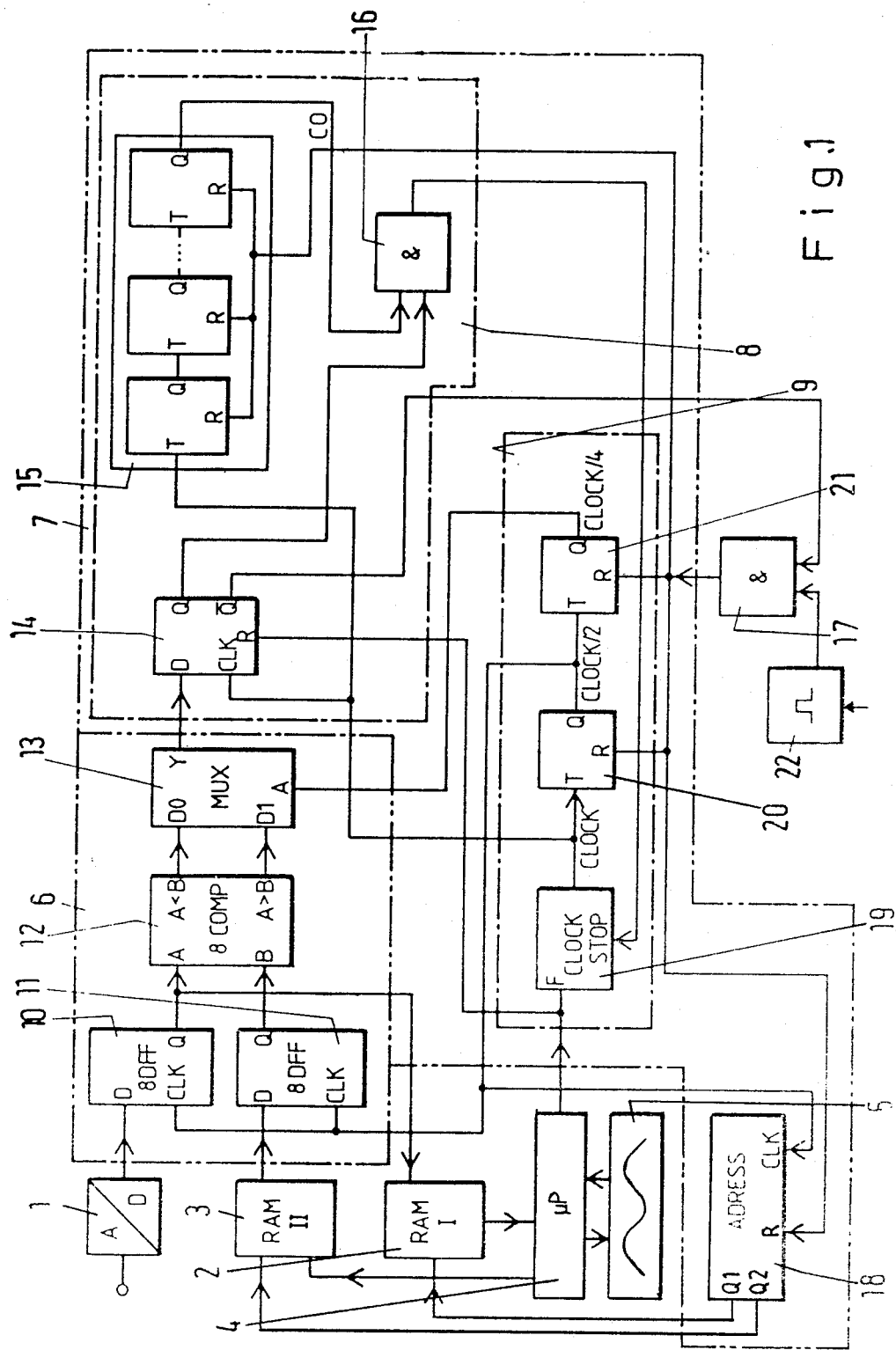
FIG. 1 is a block circuit diagram of the device according to the invention.

Referring now to the figures of the drawing in detail and first, particularly, to FIG. 1 thereof, there is seen a block circuit diagram which has been greatly simplified in order to facilitate an understanding of the invention. Details have been included only to the extent to which they are relevant to the invention.

As can be seen from FIG. 1, the device according to the invention is formed of an analog/digital converter 1, a signal curve store or memory 2, an envelope curve store or memory 3, a microprocessor 4, a signal reproduction circuit 5, a comparison circuit 6 and a control circuit 7 to which the trigger pulse of an analog trigger 22 is applied through an AND gate 17. The control circuit 7 is subdivided into a trigger circuit 8, a clock transmitter 9 and an address counter 18.

Two 8-bit-long registers formed of D-type flip-flops are located at the input of the comparison circuit 6. A first register 10 of the two 8-bit-long registers has an input D connected to the output of the A/D converter 1 and the second register 11 has an input D receiving amplitude samples delivered by the envelope curve store or memory 3. The output of the first register 10 is connected to an input A and the output of the second register 11 is connected to an input B, of a comparator 12. At the same time, the output Q of the first register 10 is also connected to the input of the signal curve store or memory 2.

The two outputs of the digital comparator 12 are connected to inputs D0 and D1 of a multiplexer 13 which has an output Y connected to an input D of a trigger flip-flop 14. Besides the trigger flip-flop 14, the trigger circuit 8 also includes a trigger counter 15 having an output Q which is connected together with an output Q of the trigger flip-flop 14 to an AND gate 16. The AND gate 16 supplies a hold command in the case of triggering to a stop input of a clock generator 19 belonging to the clock transmitter 9.

The clock transmitter 19 is followed by two toggle-type flip-flops 20, 21 which subdivide the clock frequency Clock of the clock transmitter 19 first into Clock/2 and then into Clock/4. The clock frequency Clock at the output of the clock transmitter 19 is supplied to the clock input CLK of the trigger flip-flop 14 and to the clock input T of the trigger counter 15. The cock inputs CLK of the two registers 10, 11 at the input of the comparison circuit 6 are connected to the output Q of the first toggle-type flip-flop 20 and thus receive a clock frequency Clock/2. The clock frequency Clock/4 at the output of the second toggle-type flip-flop 21 issues a switching signal to the input A of the multiplexer 13. The clock transmitter 19 also has an enable input F which is connected to the microprocessor and at the same time is connected to a reset input R of the trigger flip-flop 14.

The reset inputs R of the address counter 18, the first toggle-type flip-flop 20, the second toggle-type flip-flop 21 and the trigger counter 15 are also connected to a common connection. These circuits are supplied with the trigger signal of the analog trigger 22 through an AND gate 17 if the other input of the AND gate 17 receives a signal from an inverting output $\overline{Q}$ of the trigger flip-flop 14.

The address counter 18, which is clocked or timed with the clock frequency Clock/2 like the registers 10, 11, supplies address signals through a first address bus from an output Q1 thereof to the signal curve store or memory 2 and through a second address bus from an output Q2 thereof to the envelope curve store or memory 3. The two memories or stores 2, 3 are also connected to the microprocessor 4 which, in turn, also acts on the signal reproducing circuit 5. The modules which are required for completing an oscilloscope circuit but are without significance for the invention, are combined in the signal reproducing circuit 5. Apart from an operating unit with an appropriate key panel, this also includes, among other things, a screen on which the signal curve can be displayed. The trigger pulse of the analog trigger 22 is also derived from the modules combined therein.

FIG. 2 shows the principle of the envelope curve technique. Starting from a signal curve A, two envelope curves B, C are formed which enclose a tolerance range T. In the present case, the amplitude of the signal curve A differs from that of the lower envelope curve B by $+T/2$ and from that of the upper envelope curve C by $-T/2$. As soon as the envelope curves B, C are formed, the original signal curve A can be erased. The signal curves which then follow are monitored in order to check whether or not the amplitude thereof exceeds the tolerance range T at any point. A disturbance St occurring as a transient is shown in the drawing which breaks through the upper envelope curve C. Such a disturbance St leads to a digital triggering at the oscilloscope by means of which the curve variation is, in turn, registered on the screen. If the oscilloscope having the appropriate resolution also provides the possibility of expanding the shape of the curve, the disturbance St can be analyzed in detail.

In the text which follows, the sequence of the envelope curve method according to the invention will be explained with reference to the circuit according to FIG. 1 which is used for carrying out the method. An analog signal curve which periodically recurs and is dissected into amplitude samples is digitized by the analog/digital converter 1. The digitized amplitude samples are continuously transferred with the clock frequency Clock/2 into the 8-bit-long first register 10 and forwarded by the latter to the signal curve store or memory 2. The address counter 18 ensures that the data are successively written into the signal curve store or memory which is constructed as RAM. From there, the data pass with the aid of the microprocessor to the signal reproducing circuit 5 which causes them to be displayed on a screen.

If the signal curve which is shown corresponds to that imagined by the observer, he can initiate an operating command which causes the processor to calculate an upper envelope curve C and a lower envelope curve B by alternate addition and subtraction of a constant from the amplitude samples of the signal curve present.

According to the invention, the circuit expenditure is reduced by the fact that each of the two envelope curves B, C is formed of only half the number of amplitude samples as the original signal curve. Therefore, the amplitude samples of the upper and lower envelope curve are successively alternately read-in the envelope curve store or memory 3 provided for the two envelope curves B, C and also constructed as a RAM.

As soon as the two envelope curves are stored, the subsequent signal curves can be monitored. For this purpose, the microprocessor 4 provides an enable signal to the reset input of the trigger flip-flop 14. The same signal is also used to enable the clock transmitter 19 as a result of which the recording is started and the required curve section is repeatedly written into the signal curve store or memory 2. During this process, a trigger pulse coming from the analog trigger 22 synchronizes the amplitude samples which are newly received in the signal curve store or memory 2 with the aid of the address counter 18, in such a manner that it accurately matches the envelope curves stored in the envelope curve store or memory 3.

In order to compare the amplitude samples in the comparison circuit 6, the two envelope curves, corresponding to the signal curve, are transferred with the clock frequency Clock/2 into the 8-bit-long second register 11. The amplitude samples at the outputs of the two registers 10, 11 are compared with one another in the digital comparator which is also 8 bits long. While the input A of the comparator 12 is supplied with the signal curve, amplitude samples of the lower and of the upper envelope curve are in each case alternately applied to its input B.

The synchronizing clock of the clock transmitter 19 ensures that the A less than B results of the comparison with the upper envelope curve are present at one output of the comparator 12 while the A greater than B results with the lower envelope curve are present at its other output. The multiplexer 13, controlled with the clock frequency Clock/4, applies the two output signals of the comparator 12 to a common output Y. If an amplitude sample breaks through one of the two envelope curves, the multiplexer delivers a "high" to the input of the trigger flip-flop 14.

The trigger circuit 8, which also includes the trigger flip-flop 14, must be distinguished from the analog trigger 22. The latter has the task of determining the beginning of a new storage of amplitude values in the signal store or memory. Since this storage is controlled by the address counter, its reset input R is connected to the analog trigger 22 through the second AND gate 17.

The two toggle-type flip-flops 20, 21 and the trigger counter 15 also periodically obtain a reset signal through the same line. However, the second AND gate 17 inhibits the reset signal if no signal is present at the inverting output Q of the trigger flip-flop 14, that is to say when a "high" is applied to its input D. In this case, the trigger signal is forwarded from the output Q to the first AND gate 16, the output of which is connected to the hold input "stop" of the clock transmitter 19.

However, a trigger signal delivered by the trigger flip-flop 14 is only converted into a hold signal by the first AND gate 16 if a signal, which must come as an overflow signal CO from the output of the trigger counter 15, is also present at its second input. Since the trigger counter 15 is clocked or timed synchronously with the address counter 18 and both counters also have a matching range, the trigger counter 15 ensures that, after the occurrence of a transient, the remaining part of the respective signal curve is still written into the signal curve store or memory 2 until its end.

Thus, the circuit essentially recognizes two states. As long as the newly recorded signal curve moves within the two envelope curves, the output of the digital comparator 12 which is valid in each case remains in the "low" state and the trigger flip-flop 14 remains reset. If, however, the signal curve to be recorded changes in such a manner that it leaves the tolerance range T enclosed by the two envelope curves, the digital comparator 12 responds and the trigger flip-flop 14 is set with the next clock edge of the clock frequency Clock. The trigger counter 15 then continues to count until it stops the clock transmitter 19 with its output CO which is then enabled by the trigger flip-flop 14 through the AND gate and terminates any further storage into the signal curve store or memory 2. The signal curve shape, with the disturbance St activating the digital triggering, thus stored in the signal curve store or memory 2 can be displayed on a screen of the signal reproducing circuit 5.

Although not illustrated in FIG. 1, it can be understood without a corresponding circuit that, as an alternative to inhibiting the signal curve store or memory 2, its content can be transferred into a long-time store or memory and correspondingly the signal curve store or memory will be available for receiving new signal curves. With the appropriate equipment of the microprocessor 4 and the signal reproducing circuit 5, it is possible to display several curves jointly on the screen so that one of these is the curve with the interference signal and another one represents the last signal curve in each case, for example.

The foregoing is a description corresponding in substance to German Application P No: 37 44 398.4, dated Dec. 29, 1987, the International priority of which is being claimed for the instant application, and which is hereby made part of this application. Any material discrepancies between the foregoing specification and the aforementioned corresponding German application are to be resolved in favor of the latter.

What is claimed is:

1. Method for recording signal curves which comprises:
   (a) dissecting the signal curves into digitized amplitude samples;
   (b) supplying the digitized amplitude samples to a signal memory;
   (c) determining the signal curve to be stored with an analog trigger;
   (d) subsequently displaying an image of at least part of the stored signal curve on a screen;
   (e) generating lower and upper envelope curves enclosing a tolerance range for a signal curve stored in the signal memory and storing the envelope curves in an envelope curve memory;
   (f) continuously overwriting the signal memory with cyclically repetitive new amplitude samples of the signal curve, and comparing the new amplitude samples with time-analogous amplitude samples of the lower envelope curve and the upper envelope curve;
   (g) issuing a first switching signal when one of the two envelope curves is exceeded by at least one amplitude sample of the signal curve;
   (h) transferring amplitude samples of the signal curve arriving after the first switching signal into the signal memory until the end of the instantaneous signal curve; and
   (i) generating a second switching signal at the end of the instantaneous signal curve and stopping the overwriting of the signal memory or transferring the amplitude values contained in the signal memory into a separate long-time store.

2. Method according to claim 1, which comprises alternately successively storing the amplitude samples of the two envelope curves in the envelope curve memory, and comparing one of two successive amplitude samples of the signal curve with the corresponding amplitude sample of the lower envelope curve and comparing the other of the two successive amplitude samples of the signal curve with the corresponding amplitude sample of the upper envelope curve.

3. Device for recording signal curves, comprising an A/D converter for converting analog signal curves into digital amplitude samples, a processor for determining an operational sequence, a signal reproduction circuit connected to said processor for displaying an image of the signal curve on a screen, a signal memory connected to said processor to be continuously overwritten with cyclically repetitive amplitude samples of a signal curve, an envelope curve memory connected to said processor for receiving two envelope curves calculated by said processor from amplitude samples of a selected signal curve, a comparison circuit connected to said A/D converter and to said memories for continuously synchronously comparing amplitude samples from said A/D converter with corresponding amplitude samples from said envelope curve memory, and a control circuit connected between said comparison circuit and said processor for causing the instantaneous signal curve to be saved after an amplitude sample of the signal curve has exceeded one of the envelope curves.

4. Device according to claim 3, wherein said envelope curve memory receives an amplitude sample of an upper envelope curve and of a lower envelope curve from said processor, and successive addresses are alternately allocated to the lower envelope curve and to the upper envelope curve.

5. Device according to claim, 3 wherein said comparison circuit includes first and second registers forming an input of said comparison circuit, said registers having inputs and outputs, said input of said first register receiving the amplitude samples of the signal curve from said A/D converter and said input of said second register receiving the amplitude samples of the envelope curves from said envelope curve memory, a comparator having inputs connected to said outputs of said registers for receiving respective A and B amplitude samples, said comparator having a first output switching to "high" when the amplitude samples A are less than the amplitude samples B and a second output switching to "high" when the amplitude samples A are greater than the amplitude samples B, and a multiplexer connected to said outputs of said comparator for delivering a switching signal as soon as one of said comparator outputs switches to "high".

6. Device according to claim 5, wherein said signal curve memory receives the amplitude samples of the signal curve from said output of said first register.

7. Device according to claim 5, wherein said control circuit includes a trigger circuit being connected to said multiplexer and triggered by the switching signal of said multiplexer, a clock transmitter connected to said processor and to said trigger circuit for determining a time sequence, and an address counter connected to said clock transmitter for predetermining addresses for the amplitude samples stored in said signal curve memory and in said envelope curve memory.

8. Device according to claim 7, wherein said clock transmitter has an enable input connected to said processor, a hold input connected to said trigger circuit, and an output delivering three clock signals having frequencies "Clock", "Clock/2" and "Clock/4".

9. Device according to claim 8, wherein said clock transmitter includes a clock generator, and two toggle-type flip-flops connected downstream of said clock generator for dividing an output frequency of said clock generator first into the frequency Clock/2 and then into the frequency Clock/4.

10. Device according to claim 9, wherein said trigger circuit includes a trigger flip-flop, a trigger counter connected to said trigger flip-flop and acting as a post-trigger, and an AND gate having inputs respectively connected to said trigger flip-flop and to said trigger counter and an output delivering the hold signal to said hold input of said clock transmitter when triggering.

11. Device according to claim 10, including an analog trigger, said address counter, said toggle-type flip-flops of said clock transmitter and said trigger counter having reset inputs jointly receiving a reset signal from said analog trigger at the beginning of a new signal curve.

12. Device according to claim 11, wherein said analog trigger has an output, said trigger flip-flop has an inverting output, and including another AND gate having an input connected to said output of said analog trigger and an input connected to said inverting output of said trigger flip-flop, said other AND gate delivering a reset signal only when said trigger flip-flop does not trigger.

13. Device according to claim 10, wherein said trigger counter has a counter range corresponding to that of said address counter and said trigger counter is controlled in synchronism with the said address counter.

14. Device according to claim 10, wherein said trigger flip-flop and said trigger counter are timed with the frequency of said clock transmitter, said registers and said address counter are timed with the frequency Clock/2, and said multiplexer switches with the frequency Clock/4.

15. Device according to claim 10, wherein said enable input of said clock transmitter is connected to a reset input of said trigger flip-flop.

* * * * *